United States Patent
Shin et al.

(10) Patent No.: US 12,324,345 B2
(45) Date of Patent: Jun. 3, 2025

(54) METHOD OF DETERMINING CRYSTALLINITY AND METHOD OF MANUFACTURING A DISPLAY DEVICE USING THE SAME

(71) Applicant: Samsung Display Co., LTD., Yongin-si (KR)

(72) Inventors: Eon Pil Shin, Seoul (KR); Myoungchul Kim, Suwon-si (KR); Donghoon Lee, Seongnam-si (KR); Jihoon Seo, Asan-si (KR); Yong Woon Lim, Seoul (KR); Moonsung Choi, Incheon (KR); Hyunju Woo, Cheonan-si (KR); Seokwoo Jeong, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 428 days.

(21) Appl. No.: 17/730,442

(22) Filed: Apr. 27, 2022

(65) Prior Publication Data
US 2023/0064942 A1 Mar. 2, 2023

(30) Foreign Application Priority Data
Sep. 2, 2021 (KR) .................. 10-2021-0117131

(51) Int. Cl.
*H01L 21/66* (2006.01)
*G01N 21/65* (2006.01)
(Continued)

(52) U.S. Cl.
CPC ............. *H10K 71/00* (2023.02); *G01N 21/65* (2013.01); *H01L 22/20* (2013.01); *H10K 59/122* (2023.02);
(Continued)

(58) Field of Classification Search
CPC ........ H10K 71/00; H10K 71/30; H10K 71/60; H10K 59/122; H10K 59/1201;
(Continued)

(56) References Cited

U.S. PATENT DOCUMENTS 6,020,224 A * 2/2000 Shimogaichi ..... H01L 21/02675
257/E29.294
9,111,803 B2 * 8/2015 Oda .................. H01L 21/02532
(Continued)

FOREIGN PATENT DOCUMENTS

KR 10-0425857 7/2004
KR 10-0531413 11/2005
(Continued)

*Primary Examiner* — Nikolay K Yushin
(74) *Attorney, Agent, or Firm* — KILE PARK REED & HOUTTEMAN PLLC

(57) ABSTRACT

A method of determining crystallinity may include acquiring a Raman spectrum of each of samples that are crystallized, determining a first sample that exhibits a first Raman spectrum having a first Raman intensity that is largest among the Raman spectra, as an optimal sample, and determining a second sample that exhibits a second Raman spectrum having a second Raman intensity that is within a range from the first Raman intensity based on the first Raman intensity, as a first normal sample.

21 Claims, 13 Drawing Sheets

(51) Int. Cl.
*H01L 51/56* (2006.01)
*H10K 59/122* (2023.01)
*H10K 71/00* (2023.01)
*G01N 21/84* (2006.01)
*H10K 59/12* (2023.01)

(52) U.S. Cl.
CPC . *G01N 2021/8477* (2013.01); *H10K 59/1201* (2023.02)

(58) Field of Classification Search
CPC ...... H10K 59/12; H10K 59/123; G01N 21/65; G01N 21/84; G01N 21/01; G01N 21/25; G01N 2021/8477; G01N 2021/0112; G01N 2021/6417; G01N 2021/63; H01L 21/66; H01L 21/20609; H01L 21/02378; H01L 21/0171; H01L 22/20; H01L 22/12; H01L 22/26

See application file for complete search history.

(56) References Cited

U.S. PATENT DOCUMENTS

| | | | |
|---|---|---|---|
| 9,194,804 B2 * | 11/2015 | Yao | G01Q 30/02 |
| 10,559,600 B2 * | 2/2020 | Sugawara | H01L 27/1285 |
| 2014/0231813 A1 * | 8/2014 | Oda | H01L 21/268 |
| | | | 257/66 |
| 2015/0062561 A1 * | 3/2015 | Yao | G01N 21/658 |
| | | | 356/72 |
| 2020/0006395 A1 * | 1/2020 | Sugawara | H01L 29/458 |

FOREIGN PATENT DOCUMENTS

| | | |
|---|---|---|
| KR | 10-0554027 | 5/2006 |
| KR | 10-0615218 | 8/2006 |
| KR | 10-0796590 | 1/2008 |
| KR | 10-1012787 | 2/2011 |
| KR | 10-1020360 | 3/2011 |
| KR | 10-1243667 | 3/2013 |
| KR | 10-2015-0101643 | 9/2015 |
| KR | 10-2053483 | 1/2020 |

* cited by examiner

FIG. 7

| SAMPLE NUMBER (NO) | 1 | 2 | 3 | 4 | 5 | 6 | 7 | 8 | 9 | 10 | 11 | 12 | 13 |
|---|---|---|---|---|---|---|---|---|---|---|---|---|---|
| ENERGY OF LASER (mJ/cm²) | 405 | 410 | 415 | 420 | 425 | 430 | 435 | 440 | 445 | 450 | 455 | 460 | 465 |

METHOD OF DETERMINING CRYSTALLINITY AND METHOD OF MANUFACTURING A DISPLAY DEVICE USING THE SAME

CROSS-REFERENCE TO RELATED APPLICATION(S)

This application claims priority to and benefits of Korean Patent Application No. 10-2021-0117131 under 35 U.S.C. § 119, filed in the Korean Intellectual Property Office (KIPO) on Sep. 2, 2021, the entire contents of which are incorporated herein by reference.

BACKGROUND

1. Technical Field

The disclosure relates generally to a method of determining crystallinity and method of manufacturing a display device using the same. More specifically, the disclosure relates to a method for determining whether a silicon thin film has poor crystallinity and a method for manufacturing a display device using the same.

2. Description of the Related Art

A display device may include a thin film transistor including silicon. Examples of the silicon may include amorphous silicon and polycrystalline silicon. The amorphous silicon may have a low electron mobility of about 0.5 to about 1 $cm^2/Vs$. The polycrystalline silicon may have an electron mobility of about several tens to several hundreds of $cm^2/Vs$. However, the thin film transistor included in the display device may require polycrystalline silicon having an electron mobility that is greater than or equal to a predetermined criterion within the electron mobility of about several tens to several hundreds of $cm^2/Vs$.

The above information disclosed in this Background section is only for understanding of the background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Some embodiments provide a method of determining crystallinity with improved reliability.

Some embodiments provide a method of manufacturing a display device using the method of determining crystallinity.

A method of determining crystallinity may include acquiring a Raman spectrum of each of samples that are crystallized, determining a first sample that exhibits a first Raman spectrum having a first Raman intensity that is largest among the Raman spectra, as an optimal sample, and determining a second sample that exhibits a second Raman spectrum having a second Raman intensity that is within a range from the first Raman intensity based on the first Raman intensity, as a first normal sample.

According to an embodiment, the method of determining crystallinity may further include determining a third sample that exhibits a third Raman spectrum having a third Raman intensity that is outside the range from the first Raman intensity based on the first Raman intensity, as a preliminary normal sample.

According to an embodiment, the method of determining crystallinity may further include acquiring a full width at half maximum of each of the Raman spectra, and determining a fourth sample that exhibits a fourth Raman spectrum having a full width at half maximum that is smaller than a full width at half maximum of the first Raman spectrum of the first sample, as a defective sample.

According to an embodiment, the determining of the fourth sample as the defective sample may be performed on the preliminary normal sample.

According to an embodiment, the method of determining crystallinity may further include determining a fifth sample that exhibits a fifth Raman spectrum having a full width at half maximum that is greater than or equal to the full width at half maximum of the first Raman spectrum of the first sample, as a second normal sample.

According to an embodiment, the samples may be crystallized by irradiating lasers having different energies to the samples, respectively.

According to an embodiment, the lasers may be excimer lasers.

According to an embodiment, the acquiring of the Raman spectrum of each of the samples that are crystallized may include irradiating a Raman laser beam to each of the samples. The Raman laser beam may be irradiated in a form of a line beam.

According to an embodiment, the Raman laser beam may have a wavelength of about 532 nanometers.

According to an embodiment, each of the samples may include silicon.

A method of manufacturing a display device may include acquiring a Raman spectrum of each of samples that are crystallized by irradiating lasers having different energies to the samples, respectively, determining a first sample that exhibits a first Raman spectrum having a first Raman intensity that is largest among the Raman spectra, as an optimal sample, determining a second sample that exhibits a second Raman spectrum having a second Raman intensity that is within a range from the first Raman intensity based on the first Raman intensity, as a first normal sample, forming a preliminary active layer including amorphous silicon on a substrate, forming an active layer by irradiating a laser that is selected from a laser group including a first laser crystallizing the first sample and a second laser crystallizing the second sample, to the preliminary active layer, and forming a light emitting element on the active layer.

According to an embodiment, the method of manufacturing a display device may further include determining a third sample that exhibits a third Raman spectrum having a third Raman intensity that is outside the range from the first Raman intensity based on the first Raman intensity, as a preliminary normal sample, acquiring a full width at half maximum of each of the Raman spectra, and determining a fourth sample that exhibits a fourth Raman spectrum having a full width at half maximum that is smaller than a full width at half maximum of the first Raman spectrum of the first sample, as a defective sample.

According to an embodiment, the determining of the fourth sample as the defective sample may be performed on the preliminary normal sample.

According to an embodiment, the method of manufacturing a display device may further include determining a fifth sample that exhibits a fifth Raman spectrum having a full width at half maximum that is greater than or equal to the full width at half maximum of the first Raman spectrum of the first sample, as a second normal sample. The laser group further may include a third laser crystallizing the fifth sample.

According to an embodiment, the laser may be an excimer laser.

According to an embodiment, the acquiring of the Raman spectrum of each of the samples that are crystallized by irradiating the lasers having the different energies may include irradiating a Raman laser beam to each of the samples. The Raman laser beam may be irradiated in a form of a line beam.

According to an embodiment, each of the samples may include silicon.

According to an embodiment, the method of manufacturing a display device may further include forming a gate electrode on the active layer, and forming a source electrode and a drain electrode on the gate electrode.

According to an embodiment, the forming of the light emitting element on the active layer may include forming a pixel electrode on the source electrode and the drain electrode, forming a middle layer on the pixel electrode, and forming a common electrode on the middle layer.

According to an embodiment, the method of manufacturing a display device may further include forming a thin film encapsulation layer on the light emitting element.

According to the method of determining the crystallinity, crystallinity of a sample including polycrystalline silicon may be determined by using a Raman intensity and a full width at half maximum of a Raman spectrum. Therefore, the crystallinity of the sample may not be determined with a naked eye, so that a deviation depending on a skill level and an experience of an operator may be reduced. Reliability of the method of determining the crystallinity may be improved.

It is to be understood that both the foregoing general description and the following detailed description are examples which are intended to provide further explanation of the inventive concept as claimed.

BRIEF DESCRIPTION OF THE DRAWINGS

The accompanying drawings, which are included to provide a further understanding of the invention and are incorporated in and constitute a part of this specification, illustrate embodiments of the disclosure, and together with the description serve to explain the disclosure.

FIG. 7 is a table showing an experimental example.

DETAILED DESCRIPTION OF THE EMBODIMENTS

Figure 1:
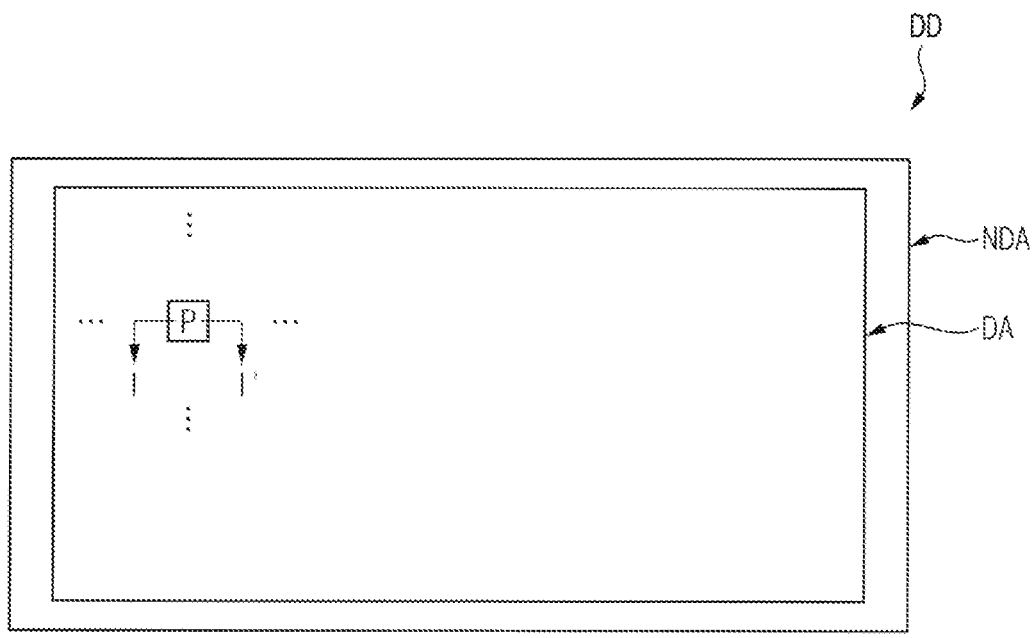
FIG. 1 is a schematic plan view showing an example of a display device.

Illustrative, non-limiting embodiments will be more clearly understood from the following detailed description in conjunction with the accompanying drawings. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, and the like may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view showing an example of a display device DD.

Referring to FIG. 1, a display device DD may include a display area DA and a non-display area NDA. The non-display area NDA may surround the display area DA. However, the non-display area NDA may be disposed on (e.g., only on) at least one side of the display area DA.

Pixels P may be disposed in the display area DA. The pixels P may include a driving element and a light emitting element (e.g., an organic light emitting diode, etc.) electrically connected to the driving element. The light emitting element may receive a signal from the driving element to emit a light. As the pixels P emit light, the display device DD may display an image. The pixels P may be arranged or disposed over the whole display area DA. For example, the pixels P may be arranged or disposed in a matrix form in the display area DA.

A driver configured to drive the pixels P may be disposed in the non-display area NDA. The driver may include a data driver, a gate driver, an emission driver, a power supply voltage generator, a timing controller, and the like. The pixels P may emit the light based on signals received from the drivers.

Figure 2:
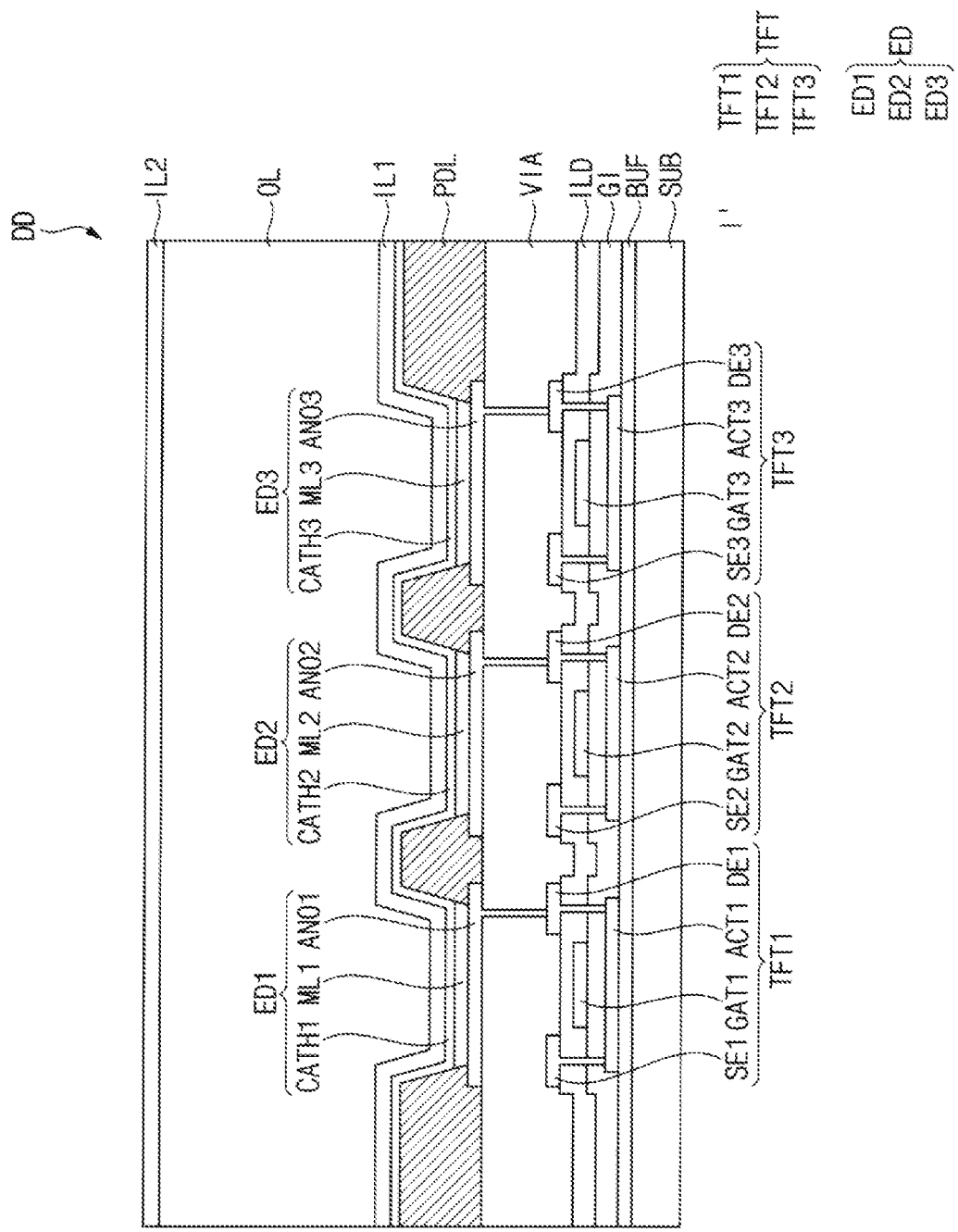
FIG. 2 is a schematic cross-sectional view showing the display device taken along line I-I' of FIG. 1.

FIG. 2 is a schematic cross-sectional view showing the display device DD taken along line I-I' of FIG. 1.

Referring to FIG. 2, the display device DD may include a substrate SUB, a buffer layer BUF, a driving element TFT, a gate insulating layer GI, an interlayer insulating layer ILD, a via insulating layer VIA, a light emitting element ED, a pixel defining layer PDL, and a thin film encapsulation layer.

The driving element TFT may include a first transistor TFT1, a second transistor TFT2, and a third transistor TFT3. The light emitting element ED may include a first light emitting element ED1, a second light emitting element ED2, and a third light emitting element ED3.

The first transistor TFT1 may include a first active layer ACT1, a first gate electrode GAT1, a first source electrode SE1, and a first drain electrode DE1. The second transistor TFT2 may include a second active layer ACT2, a second gate electrode GAT2, a second source electrode SE2, and a second drain electrode DE2. The third transistor TFT3 may include a third active layer ACT3, a third gate electrode GAT3, a third source electrode SE3, and a third drain electrode DE3. The active layer ACT may include the first active layer ACT1, the second active layer ACT2, and the third active layer ACT3. The gate electrode GAT may include the first gate electrode GAT1, the second gate electrode GAT2, and the third gate electrode GAT3. The source electrode SE may include the first source electrode SE1, the second source electrode SE2, and the third source electrode SE3. The drain electrode DE may include the first drain electrode DE1, the second drain electrode DE2, and the third drain electrode DE3.

The first light emitting element ED1 may include a first pixel electrode ANO1, a first middle layer ML1, and a first common electrode CATH1. The second light emitting element ED2 may include a second pixel electrode ANO2, a second middle layer ML2, and a second common electrode CATH2. The third light emitting element ED3 may include a third pixel electrode ANO3, a third middle layer ML3, and a third common electrode CATH3. The pixel electrode ANO may include the first pixel electrode ANO1, the second pixel electrode ANO2, and the third pixel electrode ANO3. The middle layer ML may include the first middle layer ML1, the second middle layer ML2, and the third middle layer ML3. The common electrode CATH may include the first common electrode CATH1, the second common electrode CATH2, and the third common electrode CATH3. The common electrode CATH may be integrally formed.

The thin film encapsulation layer may include a first inorganic layer ILL an organic layer OL, and a second inorganic layer IL2. Although the thin film encapsulation layer has been shown as including three layers, the disclosure is not limited thereto. For example, the thin film encapsulation layer may further include a separate inorganic layer and a separate organic layer.

The substrate SUB may include a flexible material or a rigid material. For example, the substrate SUB may include a polymer material such as polyimide. In this case, the substrate SUB may have a flexible characteristic. As another example, the substrate SUB may include glass. In this case, the substrate SUB may have a rigid characteristic.

The buffer layer BUF may be disposed on the substrate SUB. The buffer layer BUF may include an inorganic insulating material. Examples of the inorganic insulating material may include silicon oxide ($SiO_x$), silicon nitride ($SiN_x$), and silicon oxynitride ($SiO_xN_y$). These may be used alone or in combination with each other. The buffer layer BUF may prevent metal atoms or impurities from diffusing into the active layer ACT. The buffer layer BUF may control a rate of heat provided to the active layer ACT during a crystallization process for forming the active layer ACT.

The active layer ACT may be disposed on the buffer layer BUF. In an embodiment, the active layer ACT may include a silicon semiconductor. Examples of the silicon semiconductor may include amorphous silicon and polycrystalline silicon.

The amorphous silicon may have a low electron mobility of about 1 cm²/Vs or less. The polycrystalline silicon may have an electron mobility that is greater than the electron mobility of the amorphous silicon. The active layer ACT may include the polycrystalline silicon.

The polycrystalline silicon may be formed by irradiating a laser to the amorphous silicon. In a case that the laser is irradiated to the amorphous silicon, the amorphous silicon may be crystallized into polycrystalline silicon.

The electron mobility of the polycrystalline silicon may be related to crystallinity of the polycrystalline silicon. There is a demand for a method of determining crystallinity of polycrystalline silicon. This will be described below.

The gate insulating layer GI may be disposed on the buffer layer BUF. The gate insulating layer GI may cover (or overlap, e.g., in a plan view) the active layer ACT. The gate insulating layer GI may include an inorganic insulating material.

The gate electrode GAT may be disposed on the gate insulating layer GI. The gate electrode GAT may overlap (e.g., in a plan view) the active layer ACT. For example, the gate electrode GAT may at least partially overlap the active layer ACT. In response to a gate signal provided to the gate electrode GAT, a signal and/or a voltage may flow through the active layer ACT. The gate electrode GAT may include a metal, metal oxide, metal nitride, and the like. Examples of the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), and the like. These may be used alone or in combination with each other. Examples of the metal oxide may include indium tin oxide (ITO), indium zinc oxide (IZO), and the like. These may be used alone or in combination with each other. Examples of the metal nitride may include aluminum nitride ($AlN_x$), tungsten nitride ($WN_x$), chromium nitride ($CrN_x$), and the like. These may be used alone or in combination with each other.

The interlayer insulating layer ILD may be disposed on the gate insulating layer GI. The interlayer insulating layer ILD may cover the gate electrode GAT. The interlayer insulating layer ILD may include an inorganic insulating material.

The source electrode SE and the drain electrode DE may be disposed on the interlayer insulating layer ILD. The first source electrode SE1 and the first drain electrode DE1 may be electrically connected to the first active layer ACT1 through contact holes, respectively. The second source electrode SE2 and the second drain electrode DE2 may be electrically connected to the second active layer ACT2 through contact holes, respectively. The third source electrode SE3 and the third drain electrode DE3 may be electrically connected to the third active layer ACT3 through contact holes, respectively. Each of the source electrode SE and the drain electrode DE may include a metal, metal oxide, metal nitride, and the like.

The via insulating layer VIA may be disposed on the interlayer insulating layer ILD. The via insulating layer VIA may cover the source electrode SE and the drain electrode DE. The via insulating layer VIA may have a substantially flat top surface. The via insulating layer VIA may include an organic insulating material. Examples of the organic insulating material may include a photoresist, a polyacryl-based resin, a polyimide-based resin, an acryl-based resin, and the like. These may be used alone or in combination with each other.

The pixel electrode ANO may be disposed on the via insulating layer VIA. The pixel electrode ANO may be electrically connected to the drain electrode DE. The pixel electrode ANO may include a metal, metal oxide, metal nitride, and the like.

The pixel defining layer PDL may be disposed on the via insulating layer VIA. An opening that exposes each of the first to third pixel electrodes ANO1, ANO2, and ANO3 may be formed in the pixel defining layer PDL. The pixel defining layer PDL may include an organic insulating material.

The middle layer ML may be disposed on the pixel electrode ANO. The middle layer ML may include an organic material for emitting a light having a color (e.g., a preset or selected color). The middle layer ML may emit the light based on a potential difference between the pixel electrode ANO and the common electrode CATH. The middle layer ML may include an electron injection layer, an electron transport layer, an emission layer, a hole transport layer, and a hole injection layer.

The first to third light emitting elements ED1, ED2, and ED3 may emit a light having a same color. For example, all of the first to third light emitting elements ED1, ED2, and ED3 may emit a blue light. As another example, the first to third light emitting elements ED1, ED2, and ED3 may emit lights having different colors, respectively. For example, the first to third light emitting elements ED1, ED2, and ED3 may emit a red light, a green light, and a blue light, respectively.

The common electrode CATH may be disposed on the light emitting element ED. The common electrode CATH may include a metal, metal oxide, metal nitride, and the like.

The thin film encapsulation layer may be disposed on the common electrode CATH. The thin film encapsulation layer may protect the light emitting element ED from external moisture, heat, impact, and the like. The thin film encapsulation layer may have a structure in which the first inorganic layer ILL the organic layer OL, and the second inorganic layer IL2 are stacked or disposed. The organic layer OL may have a relatively thick thickness as compared with the first and second inorganic layers IL1 and IL2.

Figure 3:
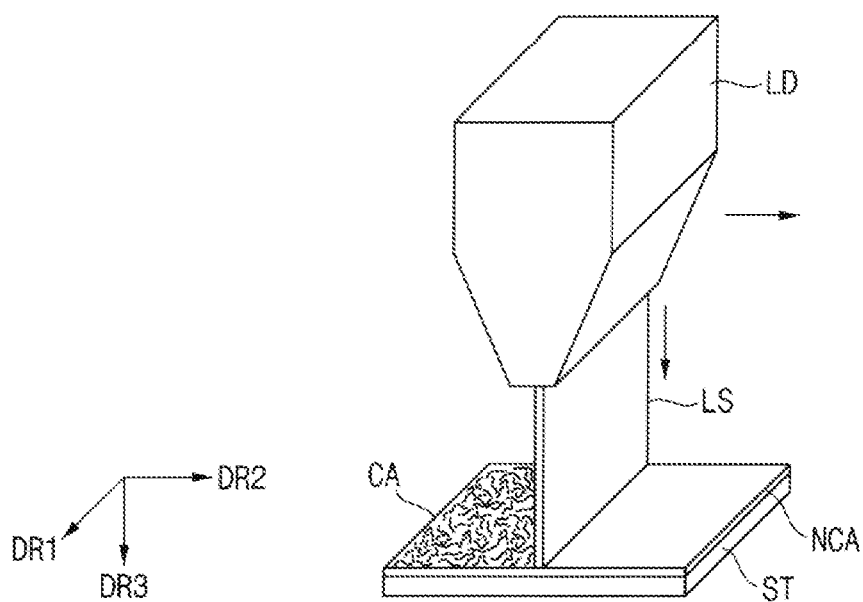
FIG. 3 is a schematic perspective view showing an example of a laser device configured to form an active layer included in the display device of FIG. 2.

FIG. 3 is a perspective view showing an example of a laser device LD configured to form an active layer ACT included in the display device DD of FIG. 2.

Referring to FIGS. 2 and 3, an amorphous silicon thin film NCA may be disposed on a stage ST. The amorphous silicon thin film NCA may be disposed on another layer on the stage ST. For example, the amorphous silicon thin film NCA may be disposed on the substrate disposed on the stage ST. The amorphous silicon thin film NCA may be referred to as a preliminary active layer.

The laser device LD may irradiate a laser LS onto the amorphous silicon thin film NCA. For example, the laser device LD may irradiate the laser LS while moving in a second direction DR2. As another example, the stage ST may move in a direction opposite to the second direction DR2, and the laser device LD may irradiate the laser LS in a fixed state. According to an embodiment, the laser LS may be an excimer laser. However, the disclosure is not limited thereto.

The amorphous silicon thin film NCA may be crystallized into a polycrystalline silicon thin film CA by the laser LS.

The polycrystalline silicon thin film CA may correspond to the active layer ACT, and may be referred to as the active layer ACT.

Protrusions may be formed on a surface of the crystallized polycrystalline silicon thin film CA. Each of the protrusions may be referred to as a hillock.

For an example, in a case that crystallinity of the crystallized polycrystalline silicon thin film CA is excessively low, an electron mobility of the polycrystalline silicon thin film CA may be relatively low, or may be substantially equal to an electron mobility of the amorphous silicon thin film NCA.

As another example, in a case that the crystallinity of the crystallized polycrystalline silicon thin film CA is excessively high, the protrusions may be non-uniformly formed on the surface of the polycrystalline silicon thin film CA. For example, the non-uniform formation of the protrusions may mean that an arrangement of the protrusions is non-uniform or intervals between the protrusions are non-uniform. In a case that the protrusions are non-uniformly formed, the polycrystalline silicon thin film CA may be stained, or a surface roughness of the polycrystalline silicon thin film CA may be increased by a height deviation of the protrusions.

Therefore, for effective crystallization of the amorphous silicon thin film NCA, the laser LS is required to have an optimal energy. For example, an optimal polycrystalline silicon thin film CA to which the laser LS having an optimal energy is irradiated may have a high electron mobility and may include the protrusions that are uniformly formed. The active layer ACT may be a polycrystalline silicon thin film Ca crystallized by irradiating the laser LS having the optimal energy.

The laser LS may be irradiated in the form of a line beam extending in a direction. For example, the line beam may extend in a first direction DR1 perpendicular to the second direction DR2 that is a movement direction of the laser device LD.

Figure 4:
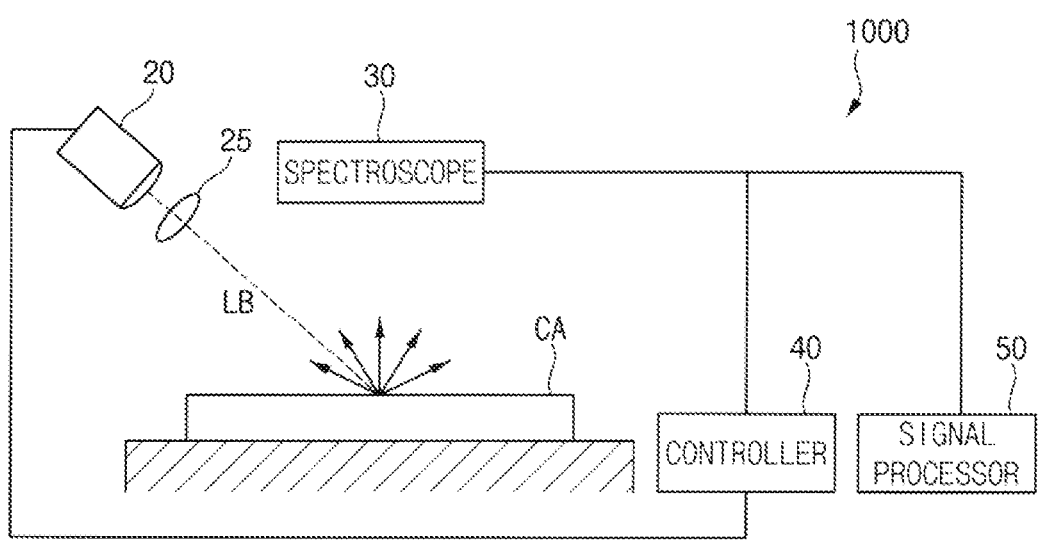
FIG. 4 is a schematic view schematically showing a Raman spectroscopy system configured to determine crystallinity of a polycrystalline silicon thin film crystallized by irradiating a laser of the laser device of FIG. 3.

FIG. 4 is a schematic view schematically showing a Raman spectroscopy system 1000 configured to determine crystallinity of a polycrystalline silicon thin film CA crystallized by irradiating a laser LS of the laser device LD of FIG. 3 onto an amorphous silicon thin film NCA.

Referring to FIG. 4, the Raman spectroscopy system 1000 may include a light source 20, a spectroscope 30, a controller 40, and a signal processor 50. The Raman spectroscopy system 1000 may use the Raman spectroscopy.

The Raman spectroscopy is a scheme of analyzing a scattered light by irradiating a Raman laser beam LB having a single wavelength to a material. For example, the single wavelength of the Raman laser beam LB may be about 532 nanometers. However, the disclosure is not limited thereto. The Raman spectroscopy is a spectroscopic analysis scheme to which the Raman effect is applied. The Raman effect is an effect that a spectrum in which a wavelength of the scattered light is slightly longer or shorter than the single wavelength of the Raman laser beam LB is observed.

The light source 20 may be spaced apart from the polycrystalline silicon thin film CA. The light source 20 may irradiate the Raman laser beam LB toward the polycrystalline silicon thin film CA. For example, the light source 20 may irradiate the Raman laser beam LB to a local area of a top surface of the polycrystalline silicon thin film CA.

According to an embodiment, the Raman laser beam LB may be irradiated in the form of a line beam. For example, the form of the line beam in which the Raman laser beam LB is irradiated may be substantially the same as the form of the line beam in which the laser LS is irradiated by the laser device LD as shown in FIG. 3. In other words, the Raman laser beam LB may not be irradiated in the form of a spot. Therefore, the light source 20 may reduce a time during which the Raman laser beam LB is irradiated to all surfaces of the polycrystalline silicon thin film CA.

Figure 5:
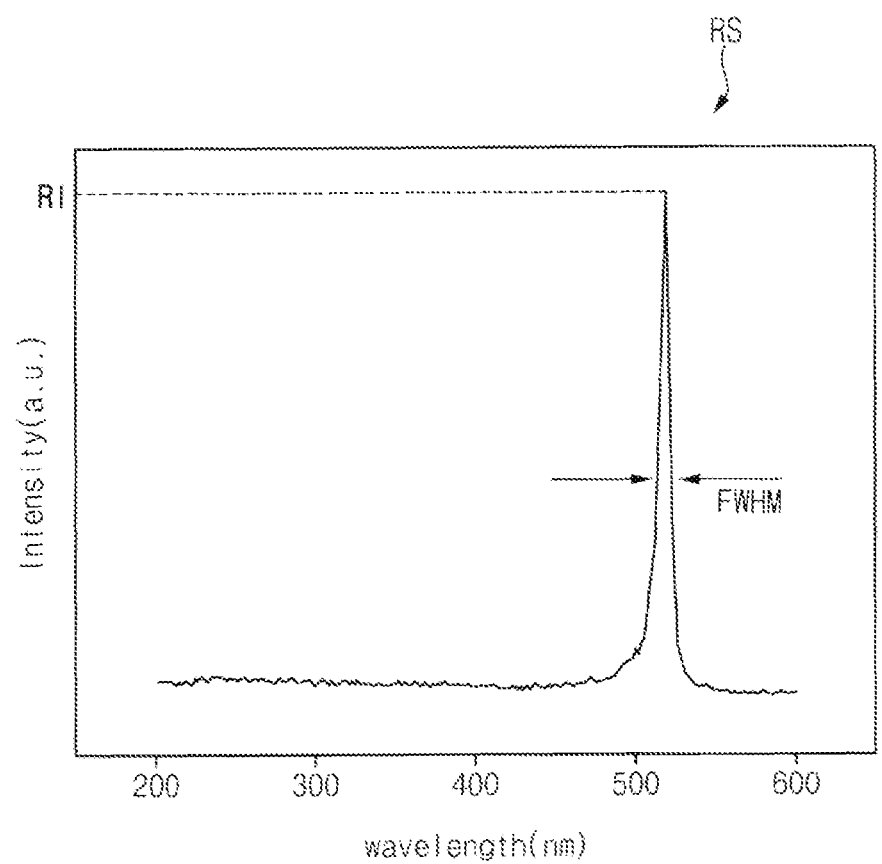
FIG. 5 is a schematic view showing a Raman spectrum acquired by the Raman spectroscopy system of FIG. 4.

FIG. 5 is a schematic view showing a Raman spectrum RS acquired by the Raman spectroscopy system 1000 of FIG. 4. An x-axis of a Raman spectrum RS may represent the wavelength of the scattered light, and a y-axis of the Raman spectrum RS may represent an intensity of the scattered light.

Referring to FIGS. 4 and 5, the Raman spectrum RS may be acquired by analyzing the scattered light of the Raman laser beam LB. The Raman spectrum RS may have a Raman intensity RI, and a full width at half maximum FWHM. The Raman intensity RI may be a maximum value of a Raman peak of the Raman spectrum RS. The full width at half maximum FWHM may be a width of the Raman spectrum RS at an intensity that is a half of the Raman intensity RI.

Figure 6:
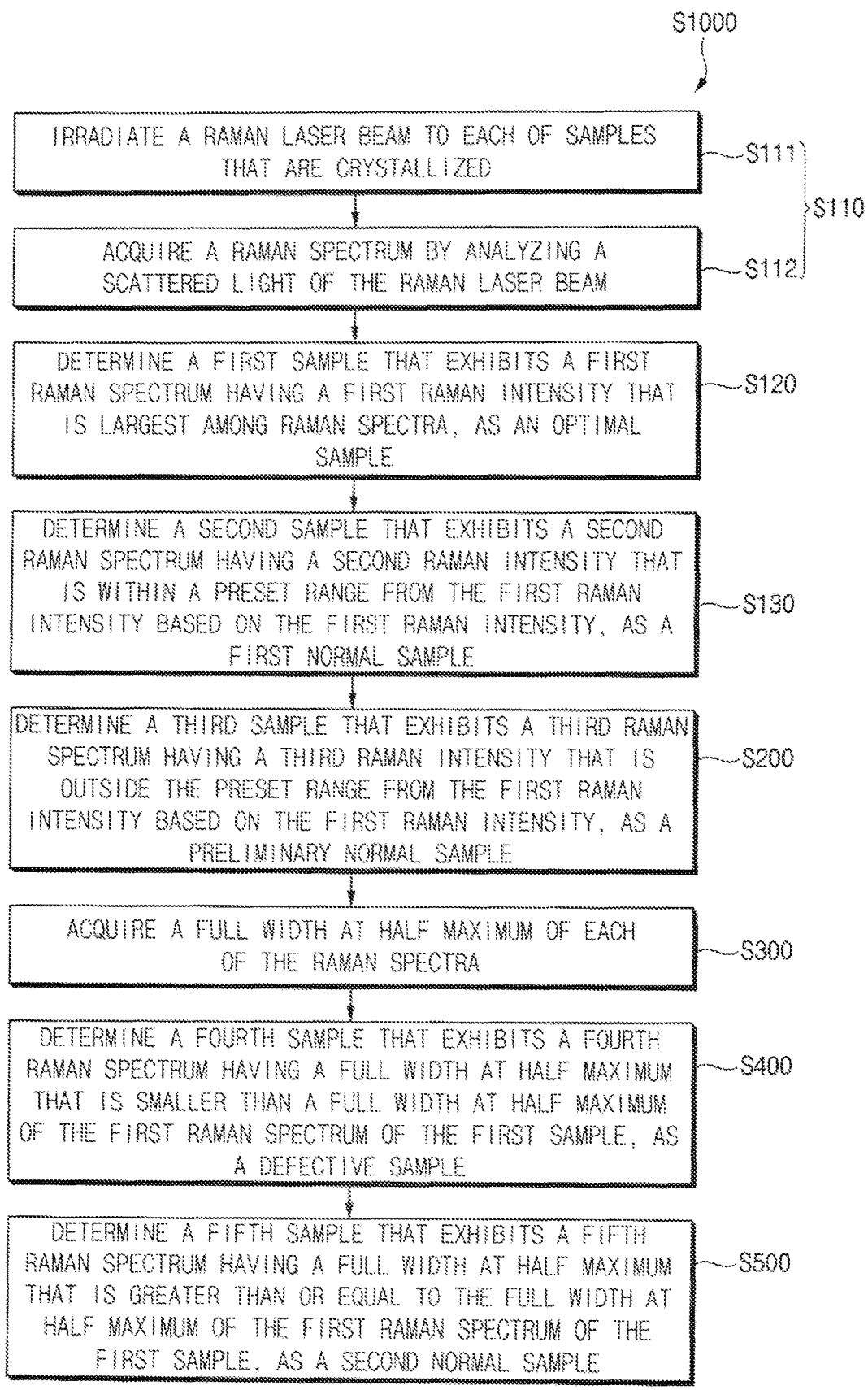
FIG. 6 is a schematic flowchart showing a method of determining crystallinity according to an embodiment of the disclosure.

FIG. 6 is a flowchart showing a method of determining crystallinity (S1000) according to an embodiment of the disclosure.

Referring to FIG. 6, a method of determining crystallinity (S1000) may include acquiring a Raman spectrum of each of samples that are crystallized (S110), determining a first sample that exhibits a first Raman spectrum having a first Raman intensity that is largest among the Raman spectra as an optimal sample (S120), determining a second sample that exhibits a second Raman spectrum having a second Raman intensity that is within a range (e.g., a preset or selected range) from the first Raman intensity based on the first Raman intensity, as a first normal sample (S130); determining a third sample that exhibits a third Raman spectrum having a third Raman intensity that is outside the range from the first Raman intensity based on the first Raman intensity, as a preliminary normal sample (S200); acquiring a full width at half maximum of each of the Raman spectra (S300); determining a fourth sample that exhibits a fourth Raman spectrum having a full width at half maximum that is smaller than a full width at half maximum of the first Raman spectrum of the first sample, as a defective sample (S400); and determining a fifth sample that exhibits a fifth Raman spectrum having a full width at half maximum that is greater than or equal to the full width at half maximum of the first Raman spectrum of the first sample, as a second normal sample (S500).

The acquiring of the Raman spectrum of each of the samples that are crystallized (S110) may include irradiating a Raman laser beam to each of the samples that are crystallized (S111); and acquiring the Raman spectrum by analyzing a scattered light of the Raman laser beam (S112).

The optimal sample may have a high electron mobility, and may be a sample in which protrusions are uniformly formed. Therefore, the optimal sample may be used as an active layer (e.g., the active layer ACT of FIG. 2).

A normal sample may include a first normal sample and a second normal sample. The first normal sample may have a high electron mobility, and may be a sample in which protrusions are relatively uniform. Although the protrusions are non-uniformly formed in the second normal sample, the second normal sample may have a high electron mobility. Since both the first normal sample and the second normal sample have a high electron mobility, the first normal sample and the second normal sample may be used as the active layer ACT.

The defective sample may have a low electron mobility. Therefore, it may be preferable not to use the defective sample as the active layer ACT.

The preliminary normal sample may include the second normal sample and the defective sample. Therefore, the preliminary normal sample may be used as the active layer ACT in a case that the preliminary normal sample is the second normal sample, and the preliminary normal sample may not be used as the active layer ACT in a case that the preliminary normal sample is the defective sample.

Referring to FIGS. 3 and 6, the laser LS may be irradiated to each of the samples. According to an embodiment, the laser LS may be an excimer laser. Each of the samples to which the laser LS is irradiated may be crystallized. Each of the samples may include silicon. For example, the samples may include the amorphous silicon thin film NCA.

Referring to FIGS. 4 and 6, the Raman laser beam LB may be irradiated to each of the samples that are crystallized (S111). According to an embodiment, the Raman laser beam LB may have a wavelength of about 532 nanometers. However, the disclosure is not limited thereto. The Raman laser beam LB may be scattered from each of the samples. The Raman spectrum (e.g., the Raman spectrum RS of FIG. 5) may be acquired by analyzing the scattered light (S112).

Referring to FIGS. 5 and 6, the Raman spectrum RS of each of the samples may be acquired. The first sample that exhibits the first Raman spectrum having the first Raman intensity that is largest among the Raman spectra may be determined as the optimal sample (S120).

The second sample that exhibits the second Raman spectrum having the second Raman intensity that is within the range from the first Raman intensity based on the first Raman intensity, may be determined as the first normal sample (S130).

The third sample that exhibits the third Raman spectrum having the third Raman intensity that is outside the range from the first Raman intensity may be determined as the preliminary normal sample (S200). According to an embodiment, the determining of the fourth sample as the defective sample (S400) may be performed on the preliminary normal sample.

The full width at half maximum FWHM of each of the Raman spectra may be acquired (S300).

The fourth sample that exhibits the fourth Raman spectrum having the full width at half maximum that is smaller than the full width at half maximum of the first Raman spectrum of the first sample, may be determined as the defective sample (S400).

The fifth sample, which exhibits the fifth Raman spectrum having the full width at half maximum that is greater than or equal to the full width at half maximum of the first Raman spectrum of the first sample, may be determined as the second normal sample (S500).

FIG. 7 is a table showing an experimental example in which lasers having different energies are irradiated to samples, respectively. Each of the samples included silicon. Lasers having different energies were irradiated to the samples including the silicon. Conditions other than the energies of the lasers irradiated to the samples were the same.

Referring to FIG. 7, a laser having an energy of about 405 mJ/cm$^2$ was irradiated to a sample no. 1 NO1. A laser having an energy of about 410 mJ/cm$^2$ was irradiated to a sample no. 2 NO2. A laser having an energy of about 415 mJ/cm$^2$ was irradiated to a sample no. 3 NO3. A laser having an energy of about 420 mJ/cm$^2$ was irradiated to a sample no. 4 NO4. A laser having an energy of about 425 mJ/cm$^2$ was irradiated to a sample no. 5 NO5. A laser having an energy of about 430 mJ/cm$^2$ was irradiated to a sample no. 6 NO6. A laser having an energy of about 435 mJ/cm$^2$ was irradiated to a sample no. 7 NO7. A laser having an energy of about 440 mJ/cm$^2$ was irradiated to a sample no. 8 NO8. A laser having an energy of about 445 mJ/cm$^2$ was irradiated to a sample no. 9 NO9. A laser having an energy of about 450 mJ/cm$^2$ was irradiated to a sample no. 10 NO10. A laser having an energy of about 455 mJ/cm$^2$ was irradiated to a sample no. 11 NO11. A laser having an energy of about 460 mJ/cm$^2$ was irradiated to a sample no. 12 NO12. A laser having an energy of about 465 mJ/cm$^2$ was irradiated to a sample no. 13 NO13.

Referring to FIGS. 3 and 7, each samples NO1, NO2, NO3, NO4, NO5, NO6, NO7, NO8, NO9, NO10, NO11, NO12, and NO13 including the amorphous silicon thin film NCA was crystallized into the polycrystalline silicon thin film CA by irradiating the laser LS to the samples NO1, NO2, NO3, NO4, NO5, NO6, NO7, NO8, NO9, NO10, NO11, NO12, and NO13.

Referring to FIGS. 4 and 7, the Raman laser beam LB having the wavelength of about 532 nanometers was irradiated to each of the samples NO1, NO2, NO3, NO4, NO5, NO6, NO7, NO8, NO9, NO10, NO11, NO12, and NO13 that are crystallized.

Referring to FIGS. 5 and 7, the Raman spectrum RS of each of the samples NO1, NO2, NO3, NO4, NO5, NO6, NO7, NO8, NO9, NO10, NO11, NO12, and NO13 was acquired by analyzing the scattered light of the Raman laser beam LB.

Figure 8:
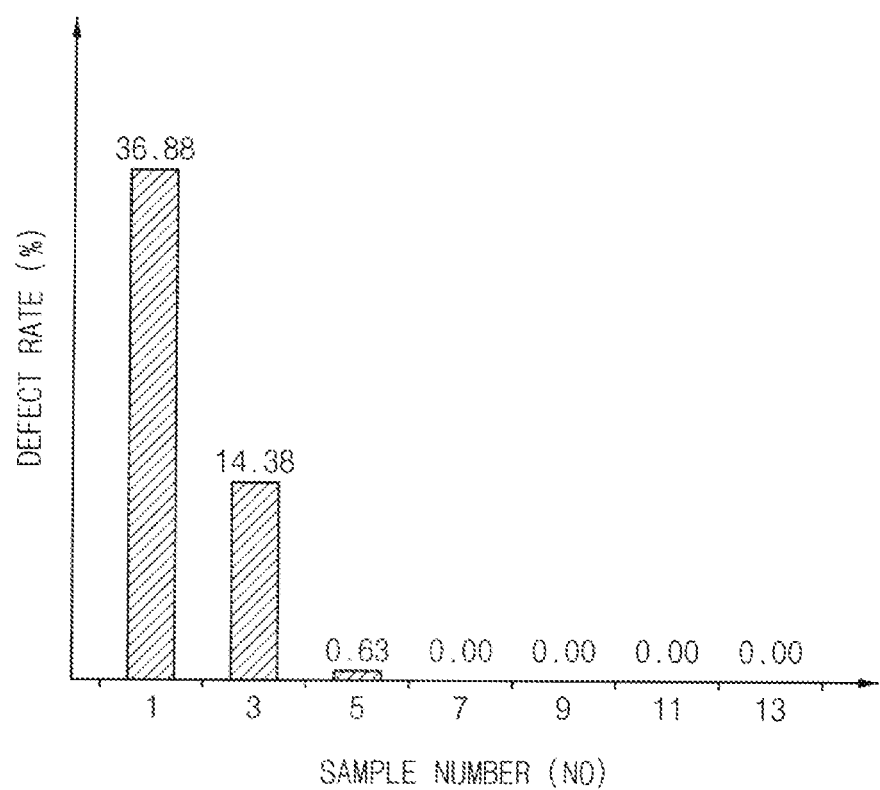
FIGS. 8 to 10 are schematic views showing results according to the experimental example of FIG. 7.
Figure 9:
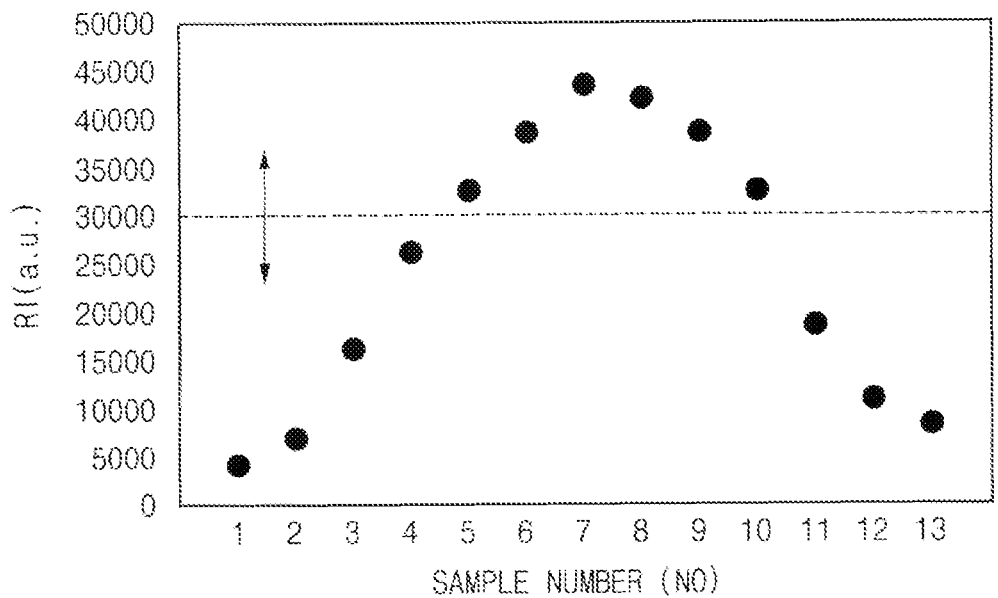
Figure 10:
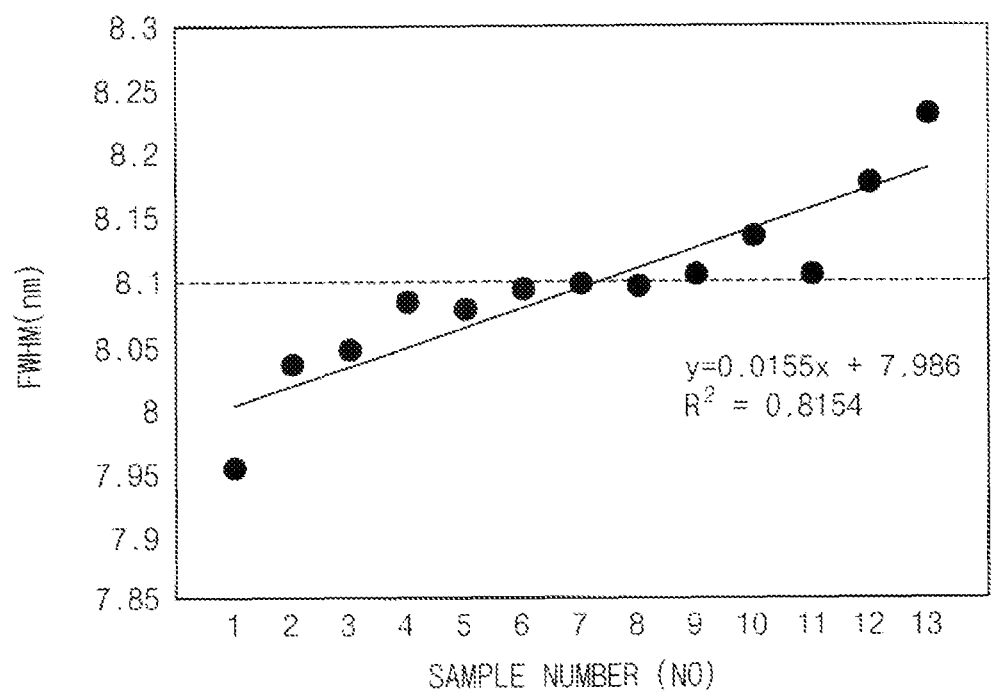

FIGS. 8 to 10 are schematic views showing results according to the experimental example of FIG. 7. FIG. 8 shows a result of inspecting whether it is appropriate to use the samples according to the experimental example of FIG. 7 as an active layer (e.g., the active layer ACT of FIG. 2). A defect rate of FIG. 8 was inspected in consideration of an electron mobility and non-uniformity of protrusions that are formed. The non-uniformity of the protrusions was determined by analyzing an atomic force microscopy (AFM) image and a fluorescence microscopy image.

Referring to FIG. 8, defect rates of some of the samples according to the experimental example was observed. A defect rate of the sample no. 1 NO1 was about 36.9%, and a defect rate of a sample no. 3 NO3 was about 14.4%. Therefore, it may be preferable not to use the sample no. 1 NO1 and the sample no. 3 NO3 as the active layer ACT.

A defect rate of a sample no. 5 NO5 was about 0.63%. Each of a sample no. 7 NO7, a sample no. 9 NO9, a sample no. 11 NO11, and a sample no. 13 NO13 had a defect rate of about 0%. Therefore, it may be preferable to use the sample no. 5 NO5, the sample no. 7 NO7, the sample no. 9 NO9, the sample no. 11 NO11, and the sample no. 13 NO13 as the active layer ACT.

Referring to FIG. 9, the sample no. 7 NO7 among the samples had a largest Raman intensity. For example, the sample no. 7 NO7 may be determined as an optimal sample.

The method of determining the crystallinity (S1000) may classify samples having a Raman intensity within a range based on the Raman intensity of the sample no. 7 NO7. For example, samples having a Raman intensity of about 30000 or more and samples having a Raman intensity of less than about 30000 may be distinguished from each other.

For example, the sample no. 5 NO5, a sample no. 6 NO6, and sample nos. 8 to 10 NO8, NO9, and NO10 may be determined as first normal samples. For example, since a Raman intensity of each of the sample no. 5 NO5, the sample no. 6 NO6, and the sample nos. 8 to 10 NO8, NO9, and NO10 is greater than about 30000, the Raman intensity of each of the sample no. 5 NO5, the sample no. 6 NO6, and the sample nos. 8 to 10 NO8, NO9, and NO10 may be included within the range based on the Raman intensity of the sample no. 7 NO7.

For example, sample nos. 1 to 4 NO1, NO2, NO3, and NO4 and sample nos. 11 to 13 NO11, NO12, and NO13 may be determined as preliminary normal samples. For example, since a Raman intensity of each of the sample nos. 1 to 4 NO1, NO2, NO3, and NO4 and the sample nos. 11 to 13 NO11, NO12, and NO13 is less than about 30000, the Raman intensity of each of the sample nos. 1 to 4 NO1, NO2, NO3, and NO4 and the sample nos. 11 to 13 NO11, NO12, and NO13 may not be included within the range based on the Raman intensity of the sample no. 7 NO7.

Referring to FIG. 10, a full width at half maximum of the sample no. 7 NO7 was about 8.1 nanometers. The method of determining the crystallinity (S1000) may classify samples having a full width at half maximum that is smaller than the full width at half maximum of the sample no. 7 NO7.

A full width at half maximum of each of the sample nos. 1 to 6 NO1, NO2, NO3, NO4, NO5, and NO6 was less than about 8.1 nanometers. According to an embodiment, the sample nos. 1 to 6 NO1, NO2, NO3, NO4, NO5, and NO6 may be determined as defective samples.

According to an embodiment, the determining of some of the samples as the defective samples may be performed on the preliminary normal sample. For example, the determining of some of the samples as the defective samples may be performed only on the preliminary normal sample. For example, only the sample nos. 1 to 4 NO1, NO2, NO3, and NO4 and the sample nos. 11 to 13 NO11, NO12, and NO13, which are determined as the preliminary normal samples, may be determined whether each of the preliminary normal samples has the full width at half maximum that is smaller than the full width at half maximum of the sample no. 7 NO7. Accordingly, since the sample no. 5 NO5 and the sample no. 6 NO6 have already been determined as the first normal samples, the sample nos. 1 to 4 NO1, NO2, NO3, and NO4 may be determined as the defective samples. For example, since the sample nos. 1 to 4 NO1, NO2, NO3, and NO4 are not included within the range based on the Raman intensity of the sample no. 7 NO7, and have the full width at half maximum that is smaller than the full width at half maximum of the sample no. 7 NO7, the sample nos. 1 to 4 NO1, NO2, NO3, and NO4 may be determined as the defective samples.

The method of determining the crystallinity (S1000) may classify samples having a full width at half maximum that is greater than or equal to the full width at half maximum of the sample no. 7 NO7.

A full width at half maximum of each of the sample nos. 8 to 13 NO8, NO9, NO10, NO11, NO12, and NO13 was greater than or equal to about 8.1 nanometers. According to an embodiment, the sample nos. 8 to 13 NO8, NO9, NO10, NO11, NO12, and NO13 may be determined as second normal samples. The sample nos. 8 to 10 NO8, NO9, and NO10 may be determined as the first normal samples, and may be determined as the second normal samples. However, as described above, since the first normal sample and the second normal sample have a high electron mobility, it may be sufficient to determine the sample nos. 8 to 10 NO8, NO9, and NO10 as normal samples including the first normal sample and the second normal sample.

According to an embodiment, the determining as the second normal sample may be performed on the preliminary normal sample. For example, the determining of the second normal sample may be performed on only the preliminary normal sample. For example, only the sample nos. 1 to 4 NO1, NO2, NO3, and NO4 and the sample nos. 11 to 13 NO11, NO12, and NO13, which are determined as the preliminary normal samples, may be subject to the classification of the samples having the full width at half maximum that is greater than or equal to the full width at half maximum of the sample no. 7 NO7. Accordingly, since the sample nos. 8 to 10 NO8, NO9, and NO10 have already been determined as the first normal samples, the sample nos. 11 to 13 NO11, NO12, and NO13 may be determined as the second normal samples.

The method of determining the crystallinity (S1000) according to an embodiment of the disclosure may determine the sample nos. 1 to 4 NO1, NO2, NO3, and NO4 as the defective samples; determine the sample no. 5 NO5, the sample no. 6 NO6, and the sample nos. 8 to 10 NO8, NO9, and NO10 as the first normal samples; determine the sample no. 7 NO7 as the optimal sample; and determine the sample nos. 11 to 13 NO11, NO12, and NO13 as the second normal samples.

Referring to FIG. 8, the method of determining the crystallinity (S1000) according to an embodiment of the disclosure may determine the sample no. 1 NO1 and the sample no. 3 NO3, which are inspected as being inappropriate to be used as the active layer (e.g., the active layer ACT of FIG. 2) and as having a high defect rate, as the defective samples. In other words, the method of determining the crystallinity (S1000) may determine the defective sample without inspecting the defect rates of the samples NO1, NO2, NO3, NO4, NO5, NO6, NO7, NO8, NO9, NO10, NO11, NO12, and NO13. Therefore, reliability of the method of determining the crystallinity may be improved.

Figure 11:
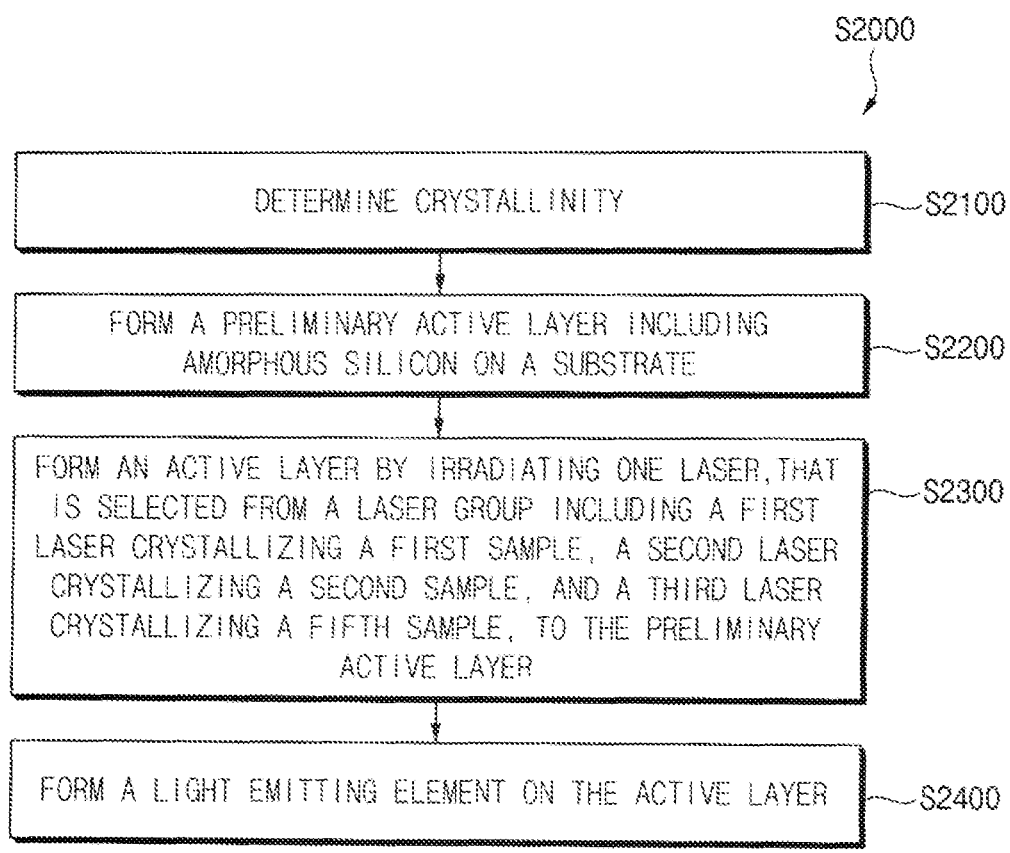
FIG. 11 is a schematic flowchart showing a method of manufacturing a display device according to an embodiment of the disclosure.

FIG. 11 is a flowchart showing a method of manufacturing a display device (S2000) according to an embodiment of the disclosure.

Referring to FIG. 11, according to an embodiment of the disclosure, a method of manufacturing a display device (S2000) may include determining crystallinity (S2100); forming a preliminary active layer including amorphous silicon on a substrate (S2200); forming an active layer by irradiating a laser that is selected from a laser group including a first laser crystallizing a first sample, a second laser crystallizing a second sample, and a third laser crystallizing a fifth sample, to the preliminary active layer (S2300); and forming a light emitting element on the active layer (S2400).

Referring to FIGS. 6 and 11, the determining of the crystallinity (S2100) in the method of manufacturing the display device according to an embodiment of the disclosure may use the method of determining the crystallinity (S1000) according to an embodiment of the disclosure.

According to an embodiment, the determining of the crystallinity (S2100) may include acquiring a Raman spectrum of each of a plurality of samples that are crystallized (S110); determining a first sample that exhibits a first Raman spectrum having a first Raman intensity that is largest among the Raman spectra as an optimal sample (S120); and determining a second sample that exhibits a second Raman spectrum having a second Raman intensity that is within a range from the first Raman intensity based on the first Raman intensity, as a first normal sample (S130) in the method of determining the crystallinity (S1000).

In this case, in the forming of the active layer by irradiating the laser to the preliminary active layer (S2300), the laser irradiated to the preliminary active layer may be selected from a laser group including a first laser crystallizing the optimal sample and a second laser crystallizing the first normal sample. Therefore, a defect rate of the formed active layer may be reduced.

According to an embodiment, the determining of the crystallinity (S2100) may further include acquiring a full width at half maximum of each of the Raman spectra (S300); and determining a fourth sample that exhibits a fourth Raman spectrum having a full width at half maximum that is smaller than a full width at half maximum of the first Raman spectrum of the first sample, as a defective sample (S400) in the method of determining the crystallinity (S1000).

In this case, in the forming of the active layer by irradiating the laser to the preliminary active layer (S2300), a laser crystallizing the defective sample may not be irradiated to the preliminary active layer. For example, the active layer may be formed by irradiating a laser having an energy that is different from an energy of the laser crystallizing the defective sample to the preliminary active layer. Therefore, a defect in the formed active layer may be prevented.

According to an embodiment, the determining of the crystallinity (S2100) may further include determining a fifth sample that exhibits a fifth Raman spectrum having a full width at half maximum that is greater than or equal to the full width at half maximum of the first Raman spectrum of the first sample, as a second normal sample (S500) in the method of determining the crystallinity (S1000).

In this case, the laser group may further include a third laser crystallizing the second normal sample. In other words, in the forming of the active layer by irradiating the laser to the preliminary active layer (S2300), the laser irradiated to the preliminary active layer may be selected from a laser group including the first laser crystallizing the optimal sample, the second laser crystallizing the first normal sample, and the third laser crystallizing the second normal sample.

FIGS. 12 to 15 are schematic cross-sectional views showing the method of manufacturing the display device of FIG. 11.

Figure 12:
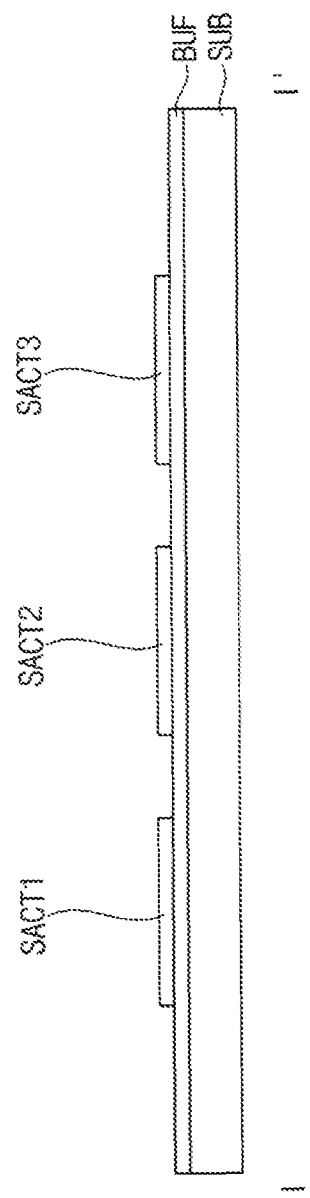
FIGS. 12 to 15 are schematic cross-sectional views showing the method of manufacturing the display device of FIG. 11.

Referring to FIG. 12, a substrate SUB may be provided. A buffer layer BUF may be formed on the substrate SUB. Preliminary active layers SACT1, SACT2, and SACT3 may be formed on the substrate SUB. The preliminary active layers SACT1, SACT2, and SACT3 may include amorphous silicon.

Figure 13:
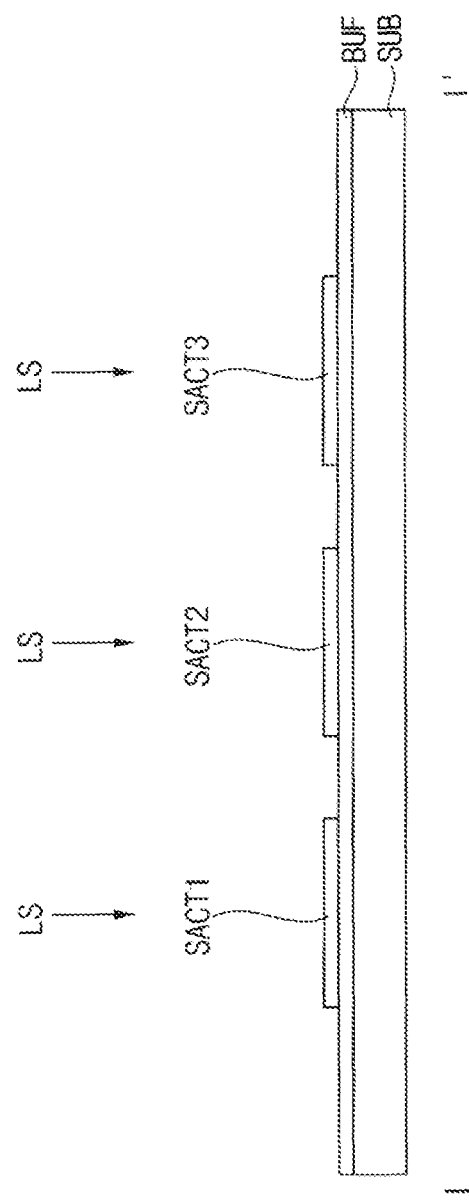

Referring to FIG. 13, a laser LS may be irradiated to the preliminary active layers SACT1, SACT2, and SACT3. The laser LS may be an excimer laser. The laser LS may crystallize the preliminary active layers SACT1, SACT2, and SACT3.

Referring to FIGS. 11 and 13, the laser LS may be a laser selected from the laser group including the first laser crystallizing the optimal sample, the second laser crystallizing the first normal sample, and the third laser crystallizing the second normal sample.

Figure 14:
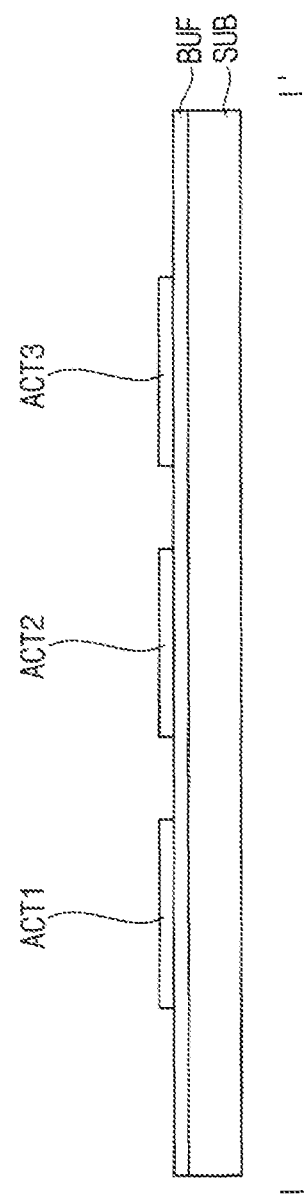

Referring to FIG. 14, the preliminary active layers SACT1, SACT2, and SACT3 may be crystallized into active layers ACT1, ACT2, and ACT3 by irradiating the laser LS to the preliminary active layers SACT1, SACT2, and SACT3. The active layers ACT1, ACT2, and ACT3 may include polycrystalline silicon.

Figure 15:
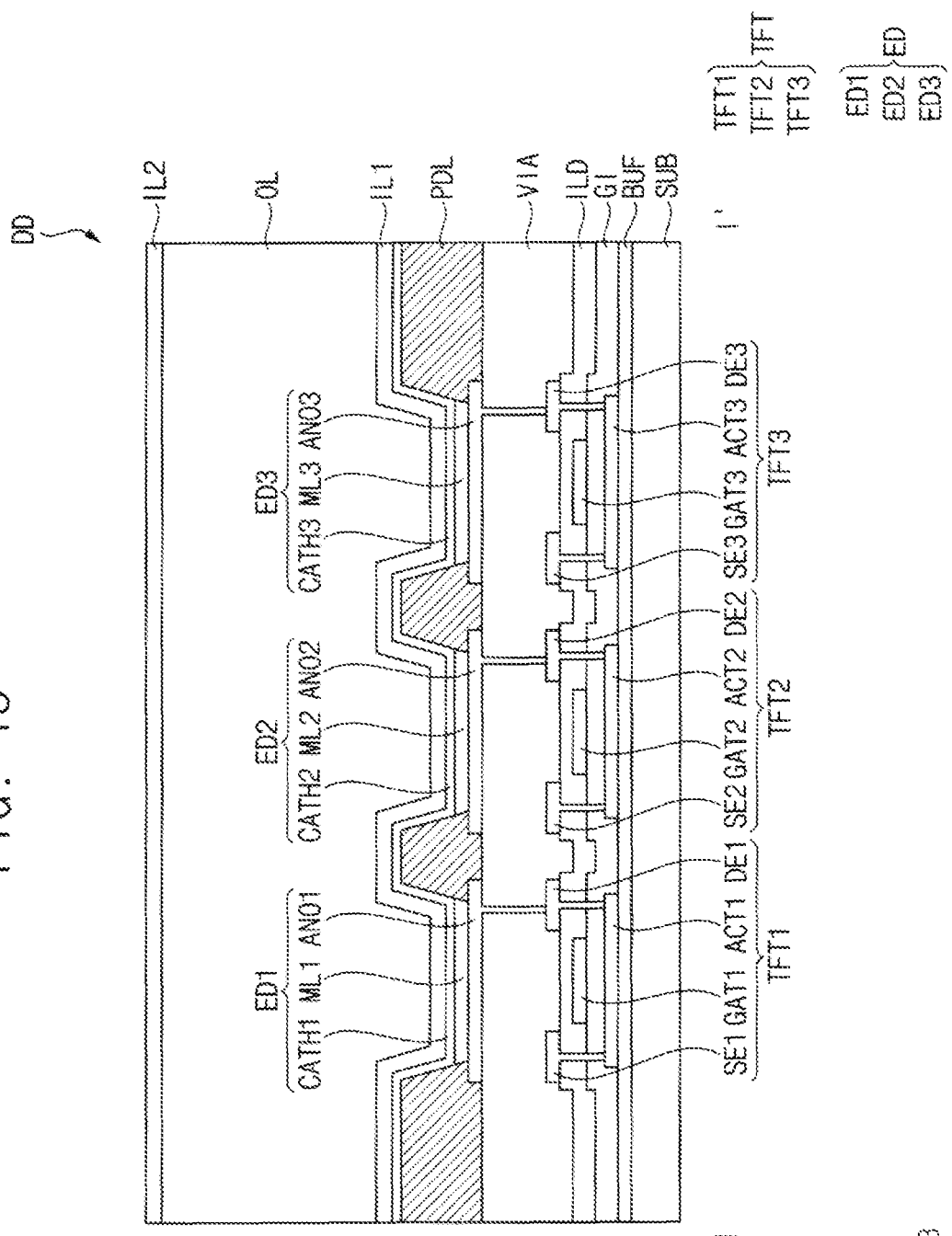

Referring to FIG. 15, a gate electrode GAT may be formed on the active layer ACT. A source electrode SE and a drain electrode DE may be formed on the gate electrode GAT. A pixel electrode ANO may be formed on the source electrode SE and the drain electrode DE. A middle layer ML may be formed on the pixel electrode ANO. A common electrode CATH may be formed on the middle layer ML. A thin film encapsulation layer ILL OL, and IL2 may be formed on the common electrode CATH.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A method of determining crystallinity, the method comprising:
    acquiring a Raman spectrum of each of samples that are crystallized;
    determining a first sample that exhibits a first Raman spectrum having a first Raman intensity that is largest among the Raman spectra, as an optimal sample; and
    determining a second sample that exhibits a second Raman spectrum having a second Raman intensity that is within a range from the first Raman intensity based on the first Raman intensity, as a first normal sample; and
    determining whether a fourth sample is a defective sample relative to the first Raman spectrum of the first sample.

2. The method of claim 1, wherein each of the samples includes silicon.

3. The method of claim 1, wherein the samples are crystallized by irradiating lasers having different energies to the samples, respectively.

4. The method of claim 3, wherein the lasers are excimer lasers.

5. The method of claim 1, wherein
    the acquiring of the Raman spectrum of each of the samples that are crystallized includes irradiating a Raman laser beam to each of the samples, and
    the Raman laser beam is irradiated in a form of a line beam.

6. The method of claim 5, wherein the Raman laser beam has a wavelength of about 532 nanometers.

7. The method of claim 1, further comprising:
    determining a third sample that exhibits a third Raman spectrum having a third Raman intensity that is outside the range from the first Raman intensity based on the first Raman intensity, as a preliminary normal sample.

8. The method of claim 7, further comprising:
    acquiring a full width at half maximum of each of the Raman spectra; and
    determining the fourth sample that exhibits a fourth Raman spectrum having a full width at half maximum that is smaller than a full width at half maximum of the first Raman spectrum of the first sample, as the defective sample.

9. The method of claim 8, wherein the determining of the fourth sample as the defective sample is performed on the preliminary normal sample.

10. The method of claim 8, further comprising:
    determining a fifth sample that exhibits a fifth Raman spectrum having a full width at half maximum that is greater than or equal to the full width at half maximum of the first Raman spectrum of the first sample, as a second normal sample.

11. A method of manufacturing a display device, the method comprising:
acquiring a Raman spectrum of each of samples that are crystallized by irradiating lasers having different energies to the samples, respectively;
determining a first sample that exhibits a first Raman spectrum having a first Raman intensity that is largest among the Raman spectra, as an optimal sample;
determining a second sample that exhibits a second Raman spectrum having a second Raman intensity that is within a range from the first Raman intensity based on the first Raman intensity, as a first normal sample;
determining whether a fourth sample is a defective sample relative to the first Raman spectrum of the first sample:
forming a preliminary active layer including amorphous silicon on a substrate;
forming an active layer by irradiating a laser that is selected from a laser group including a first laser crystallizing the first sample and a second laser crystallizing the second sample, to the preliminary active layer; and
forming a light emitting element on the active layer.

12. The method of claim 11, wherein the laser is an excimer laser.

13. The method of claim 11, wherein
the acquiring of the Raman spectrum of each of the samples that are crystallized by irradiating the lasers having the different energies includes irradiating a Raman laser beam to each of the samples, and
the Raman laser beam is irradiated in a form of a line beam.

14. The method of claim 11, wherein each of the samples includes silicon.

15. The method of claim 11, further comprising:
forming a thin film encapsulation layer on the light emitting element.

16. The method of claim 11, further comprising:
forming a plurality of the preliminary active layers spaced apart from each other directly on a buffer layer directly contacting a substrate prior to the preliminary active layers being irradiated with the laser and the buffer layer extending continuously between the preliminary active layers.

17. The method of claim 11, further comprising:
forming a gate electrode on the active layer; and
forming a source electrode and a drain electrode on the gate electrode.

18. The method of claim 17, wherein the forming of the light emitting element on the active layer includes:
forming a pixel electrode on the source electrode and the drain electrode;
forming a middle layer on the pixel electrode; and
forming a common electrode on the middle layer.

19. The method of claim 11, further comprising:
determining a third sample that exhibits a third Raman spectrum having a third Raman intensity that is outside the range from the first Raman intensity based on the first Raman intensity, as a preliminary normal sample;
acquiring a full width at half maximum of each of the Raman spectra; and
determining the fourth sample that exhibits a fourth Raman spectrum having a full width at half maximum that is smaller than a full width at half maximum of the first Raman spectrum of the first sample, as the defective sample.

20. The method of claim 19, wherein the determining of the fourth sample as the defective sample is performed on the preliminary normal sample.

21. The method of claim 19, further comprising:
determining a fifth sample that exhibits a fifth Raman spectrum having a full width at half maximum that is greater than or equal to the full width at half maximum of the first Raman spectrum of the first sample, as a second normal sample,
wherein the laser group further includes a third laser crystallizing the fifth sample.

* * * * *